United States Patent
Yu (10) Patent No.: US 6,822,333 B1
(45) Date of Patent: Nov. 23, 2004

(54) METHODS OF FILLING CONSTRAINED SPACES WITH INSULATING MATERIALS AND/OR OF FORMING CONTACT HOLES AND/OR CONTACTS IN AN INTEGRATED CIRCUIT

(75) Inventor: Jengyi Yu, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/954,382

(22) Filed: Sep. 12, 2001

Related U.S. Application Data (62) Division of application No. 09/300,817, filed on Apr. 27, 1999, now Pat. No. 6,303,496.

(51) Int. Cl.[7] .......................... H01L 23/48; H01L 23/52; H01L 29/40
(52) U.S. Cl. ................... 257/774; 257/635; 257/773; 438/668; 438/666; 438/637
(58) Field of Search .............................. 257/635, 773, 257/774, 200, 244, 296, 300, 368, 392, 405, 636, 637, 647, 649; 438/668, 666, 637

(56) References Cited

U.S. PATENT DOCUMENTS

| | | | | |
|---|---|---|---|---|
| 4,291,322 A | * | 9/1981 | Clemons et al. ............ 357/23 |
| 4,474,831 A | * | 10/1984 | Downey ..................... 427/55 |
| 5,200,358 A | * | 4/1993 | Bollinger et al. .......... 437/180 |
| 5,278,103 A | * | 1/1994 | Mallon et al. .............. 437/240 |
| 5,314,724 A | * | 5/1994 | Tsukune et al. ............. 427/489 |
| 5,377,072 A | * | 12/1994 | Sparkman et al. ........ 361/306.2 |
| 5,567,970 A | * | 10/1996 | Sheu et al. ................. 257/390 |
| 5,652,182 A | * | 7/1997 | Cleeves ...................... 437/195 |
| 5,719,084 A | * | 2/1998 | Mallon et al. .............. 438/783 |
| 5,734,607 A | * | 3/1998 | Sung et al. ............ 365/185.01 |
| 5,741,737 A | * | 4/1998 | Kachelmeier ............... 438/286 |
| 5,843,839 A | * | 12/1998 | Ng .............................. 438/637 |
| 5,902,126 A | * | 5/1999 | Hong et al. ................. 438/396 |
| 6,489,213 B1 | * | 12/2002 | Hsueh et al. ............... 438/382 |
| 2003/0045093 A1 | * | 3/2003 | Givens et al. .............. 438/644 |

OTHER PUBLICATIONS

Stanley Wolf, Silicon Processing for the VLSI ERA, Lattice Press, vol. 1, p. 188.*

* cited by examiner

Primary Examiner—Mary Wilczewski
Assistant Examiner—Monica Lewis
(74) Attorney, Agent, or Firm—Bradley T. Sako (57) ABSTRACT

According to one embodiment (500), a method of depositing an insulating layer to fill constrained spaces on an integrated circuit is disclosed. Gate structures are formed that include sidewall structures (502 and 504). An insulating layer may then be deposited over the gate structures (506). An insulating layer may be deposited by high density plasma CVD to create a silicon dioxide layer with relatively high levels of phosphorous. An insulating layer formed in this manner may fill constrained spaces and may not include a following reflow step. This may allow for a smaller thermal budget and may reduce process complexity and/or cycle time. In the event the insulating layer is substantially phosphosilicate glass (PSG), the formation of a "cap" layer of undoped silicon oxide may be avoided. Without a cap layer, contact holes may be etched through an insulating layer with a single etch step. This may also reduce process complexity and/or cycle time.

12 Claims, 9 Drawing Sheets

BACKGROUND ART

FIG. 8I
BACKGROUND ART

METHODS OF FILLING CONSTRAINED SPACES WITH INSULATING MATERIALS AND/OR OF FORMING CONTACT HOLES AND/OR CONTACTS IN AN INTEGRATED CIRCUIT

This application is a divisional of patent application Ser. No. 09/300,817 filed Apr. 27, 1999 now U.S. Pat. No. 6,303,496.

TECHNICAL FIELD

The present invention relates generally to the fabrication of semiconductor devices, and more particularly the formation of insulating materials between tightly spaced structures, where a contact hole may be formed.

BACKGROUND OF INVENTION

Many types of integrated circuits are fabricated using layers of conductive, semiconductive, and/or insulating materials. For example, an integrated circuit may include a substrate in which a number of active devices (such as transistors) are formed. Such active devices are then connected to one another by one or more conductive or semiconductive layers (referred to herein as "conducting layers"). The interconnecting conducting layers are separated from one another by insulating layers. Insulating and conducting layers are typically deposited according to a predetermined deposition "recipe" which may define the various mat conditions and environment used to deposit a layer. Recipes may also be used to etch or pattern an insulating or conducting layer. For example, an etch recipe may be used to form contact holes in an insulating layer, while another set of recipes may be used to pattern a conducting layer.

Conducting layers may be composites of one or more conductive (or semiconductive) materials. As just a few examples, a conducting layer can include a fist layer of conventionally doped polycrystalline silicon (polysilicon) and a second layer of "silicide" (silicon-metal alloy). Alternatively, a conducting layer can include a titanium(Ti)-tungsten(W) alloy layered onto bulk aluminum, with an underlying barrier layer comprising Ti, Ti-nitride (TiN), or a Ti alloy, to name just a few. Similarly, insulating layers can also be composites. As just one example, an insulating layer may include a "doped" silicon dioxide ("oxide") and an "undoped" silicon oxide. The doped silicon oxide can include dopant elements, such as boron and phosphorous, while the undoped silicon oxide will be essentially free of dopant elements.

Composite insulating layers and/or conducting layers can be undesirable as an increase in the number of layers used to form an integrated circuit generally results in a corresponding increase in the complexity and cost of the fabrication process. For example, a larger number of layers may result in a larger number of layer formation steps, and an increase in the "cycle time" (the time required to process a batch of wafers on which the integrated circuits are formed).

An insulating layer may perform a variety of functions in an integrated circuit. For example, an insulating layer may serve to electrically isolate one conducting layer or structure from another. Further, an insulating layer may serve as the surface on which subsequent layers are formed and patterned. Therefore, in many cases it is desirable for an insulating layer to provide a relatively planar surface. Planar surfaces are more desirable than non-planar surfaces, as typical, conventional lithographic patterning processes provide better results the more planar the surface. As just one example, certain photolithographic techniques using photoresist for producing relatively small structures can have more restricted fields of focus. If a layer on which photoresist is deposited is not planar, the photoresist may not adequately transfer the desired etch pattern. It is thus desirable to provide insulating layers with planar surfaces.

Connections between conducting layers may be made by structures referred to as contacts and "vias." A typical contact and/or via is formed by etching a hole through one or more insulating layers, and then filling the hole with a conductive or semiconductive material. One concern with certain contact structures is the alignment of the contact with a lower conducting layer. Because a contact is usually formed by etching a hole through an insulating layer to an underlying conducting layer, it is desirable for the etched hole to be situated directly over the desired contact location in the lower conducing layer.

Another concern regarding the formation of contacts is the etch process that is used to form a contact hole. In the event a contact hole is etched through a composite insulating layer, the etch process may include a different recipe for each of the different insulating materials in the composite layer. This can also increase cycle time and/or add to the complexity of the fabrication process.

Yet another concern regarding contacts and/or vias is the area of the contact The area of a contact to a substrate can be of particular concern, as the substrate surface area also forms other important features, such as transistor channels, transistor isolation structures, transistor diffusion regions, and/or wells.

Figure 7:
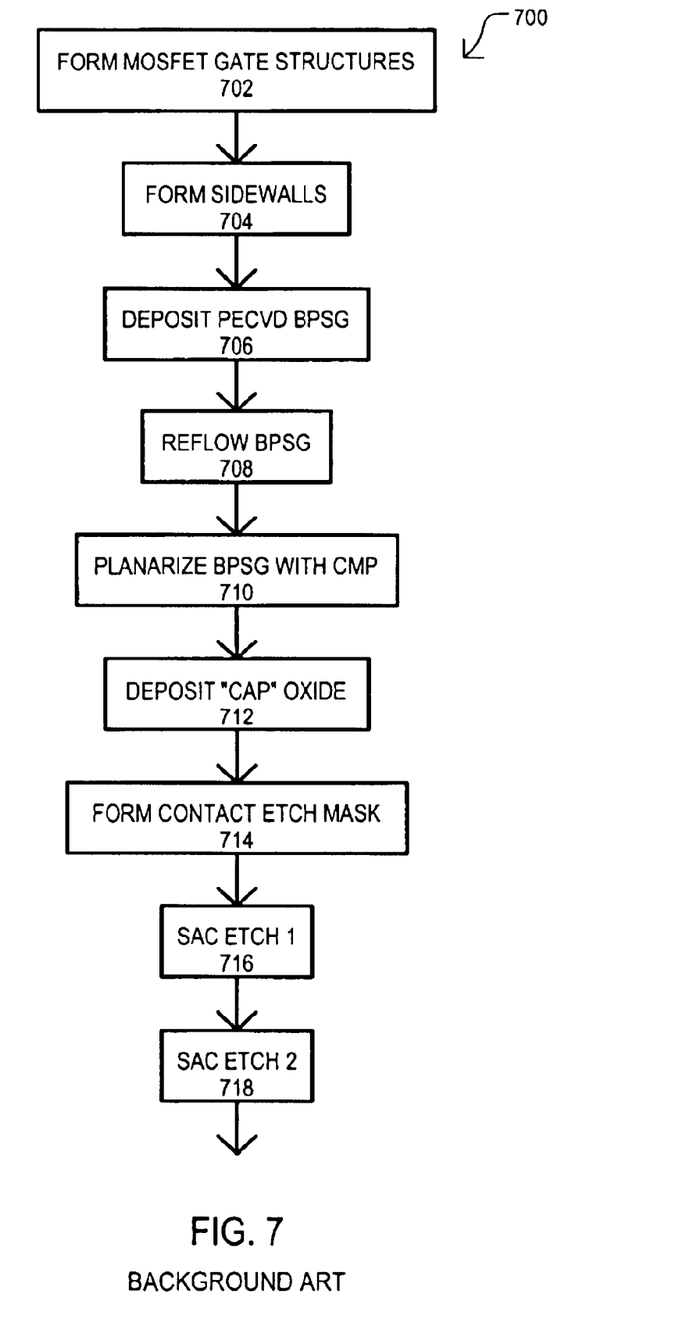
FIG. 7 is a flow diagram illustrating a conventional method for forming self-aligned contacts in an integrated circuit.

To better understand the formation of certain integrated circuit structures, including contacts, a conventional self-aligned contact (SAC) approach is set forth in FIGS. 7 and 8A–8I. FIG. 7 is a flowchart illustrating the general steps involved in forming a self-aligned contact for an integrated circuit that includes metal-oxide-semiconductor (MOS) transistors. FIGS. 8A–8I set forth a number of side cross-sectional views of a portion of an integrated circuit following the various steps described in FIG. 7.

The process set forth in FIG. 7 is designated by the general reference character 700, and begins by forming MOS field effect transistor (FET) gate structures (step 702). A portion of an integrated circuit following step 702 is set forth in FIG. 8A. MOSFET gate structures 800 are formed on a gate oxide layer 802. The gate oxide layer 802 is formed on a substrate 804. The MOSFET gate structures 800 include conductive portions 806 and insulating portions 808. In order to form as small a transistor as possible, the MOSFET gate structures 800 are patterned to have a desired minimum length (shown in the horizontal direction in FIG. 8A). Similarly, the distance between adjacent conductive portions 806 is likewise made as small as possible. Consequently, gate length and minimum spacing between adjacent conductive portions 806 may represent the patterning limits of an etch process. Minimum structure widths and structure separations, which may affect the overall operation of an integrated circuit, are often considered "critical dimensions" (CDs) that should be monitored during and/or after the fabrication of an integrated circuit to ensure proper performance. A substrate 804 may have wells formed therein by a previous substrate doping step. A substrate 804 may also include isolation structures formed therein by a previous substrate isolation structure forming step.

Figure 8A:
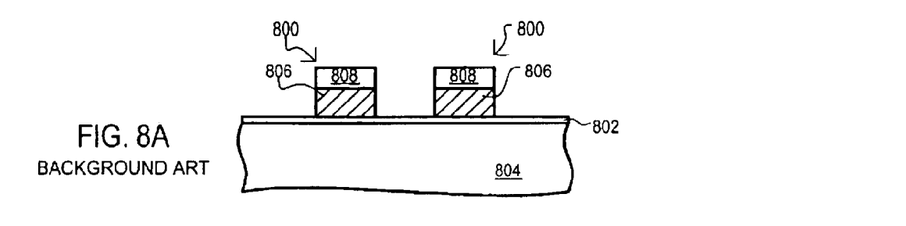
FIGS. 8A–8I are side cross-sectional views of an integrated circuit fabricated according to the method of FIG. 7.
Figure 8B:
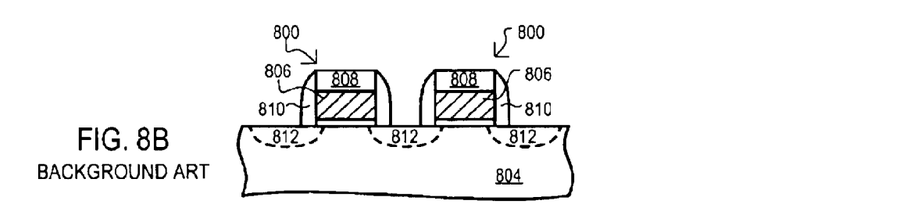

As set forth in FIG. 8B, following the formation of gate structures 800, diffusion regions 812 may be formed by doping the substrate 804 with predetermined dopants, usually to form p-n junctions. Such a doping step may include a source and/or drain doping step (which can include ion implantation and subsequent annealing steps) that can be used to form lightly doped diffusion structures, such as lightly doped drains (LDDs).

The process 700 continues by forming sidewalls on the gate structures (step 704). A portion of an integrated circuit following step 704 is set forth in FIG. 8B. Sidewalls 810 include insulating structures, and are shown to be formed on the sides of the gate structures 800. A conventional approach to forming sidewalls 810 includes forming an insulating layer over the gate structures 800, and subsequently anisotropically etching the insulating layer Additional doping of diffusion regions 812 may occur following the formation of sidewalls 810. As just one example, a subsequent diffusion step (which can also include ion implantation and subsequent annealing steps) may be used to form diffusion structures, such as tranistor sources and/or drains.

An important aspect of forming diffusion regions 812 is controlling their depth and/or lateral extent. Subjecting a diffusion region to temperature cycles following their initial formation can result in the dopants of the diffusion region diffusing deeper and/or further than desired, increasing the extents of the junction, and/or lowering the "abruptness" of a dopant concentration at the edge of a p-n junction. Too many temperature cycles may thus result in adverse transistor operation due to junction breakdown or "punch-trough" current, to name just two example. Consequently, the fabrication process of an integrated circuit may emphasize minimizing a device's exposure to temperature cycles (keeping as small a "thermal budget" as possible).

Figure 8C:
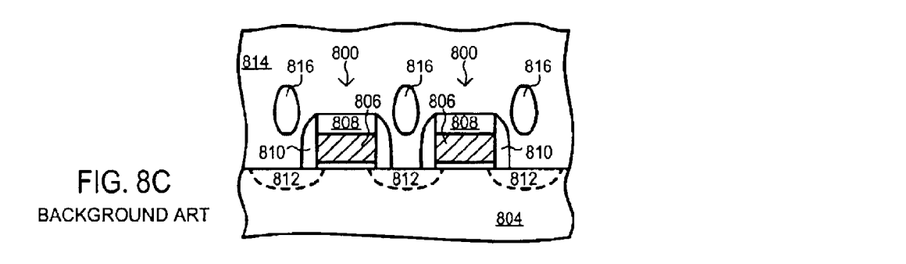

Following the formation of sidewalls 810, the conventional process 700 continues with the deposition of an insulating layer of boron and phosphorous doped silicon dioxide (borophosphosilicate glass, or "BPSG") (step 706). A portion of an integrated circuit following step 706 is set forth in FIG. 8C. Referring now to FIG. 8C, the BPSG layer 814 is shown to be deposited over the gate structures 800. In order to fill in, as much as possible, the space between adjacent gate structures 800, the BPSG may be deposited using chemical vapor deposition (CVD).

BPSG is a typical conventional choice for an insulating material due to its low "reflow" temperature. Reflow involves heating a layer so that the layer becomes more malleable, and thus flows to fill in the lowest lying space. The reflowed layer may thus become more planar than the originally deposited layer. Generally, the higher the concentration of boron and phosphorous, the lower the reflow temperature of the BPSG. BPSG is also desirable in that it can be a getterer for undesirable mobile ions, such as sodium, that can result in reliability failures in integrated circuits. Unfortunately, BPSG can have undesirable properties as well. The boron ions within BPSG can out-diffuse from the BPSG into the substrate, unintentionally doping the substrate. In addition, boron dopants can out-diffuse into polysilicon lines, unintentionally lowering or raising the conductivity of such lines.

While BPSG provides a relatively low reflow temperature, there are limits to BPSG reflow temperatures. Such limits arise out of the adverse effects presented by highly doped BPSG. Relatively high concentrations of boron (e.g., over 5% by weight) may make the resulting BPSG film unstable and hygroscopic (attract moisture). Unstable BPSG can crack and/or form boron rich crystals. BPSG cracks can ruin the insulating properties of the BPSG, while boron rich crystals may result in non-planar surfaces and/or micro-masking etch defects. The hygroscopic nature of conventional high-concentration BPSG can create bubbles, or result in forming one or more phosphorous-based acids, which may corrode conductive lines, such as those containing aluminum.

Another insulating material is phosphorous doped glass (phosphosilicate glass, or "PSG"). PSG is generally not used in conventional approaches due to its higher flow temperature. The flow temperature can be lowered by increasing the concentration of phosphorous, but higher concentrations of conventional PSG may have the drawbacks discussed above, including the formation of bubbles and/or acids.

Referring once again to FIG. 8C, the side cross-sectional view illustrates a drawback to using conventional BPSG to cover CD spacings. Conventional BPSG often contains voids 816 between minimum spaced sutures (such as MOSFET gate structures 800). Voids 816 are undesirable as they can trap moisture and/or particles that can adversely affect the reliability of an integrated circuit. Further, if a void is exposed by a subsequent etch step, a conductive layer may unintentionally be deposited in a void 816, and not be removed by a patterning step. Such conductive layer residues may form "stringers" that can cause unwanted short circuits between conductive lines. Voids may also result in unpredictable etch results.

One way of describing a spacing between structures is with an "aspect ratio." An aspect ratio sets forth the ratio between a structure's height and its width. Constrained spaces having high aspect ratios (for example, aspect ratios greater than or equal to 7:1) may be difficult to fill without a reflow step.

Figure 8D:
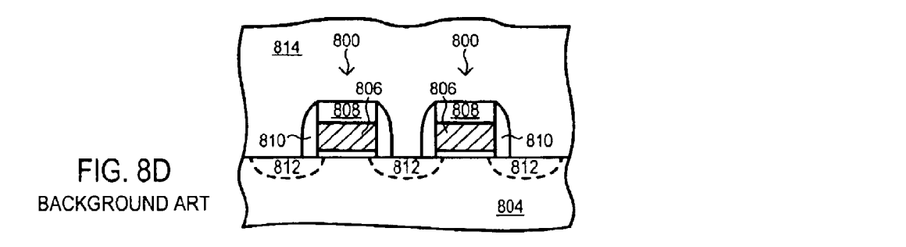
Figure 8E:
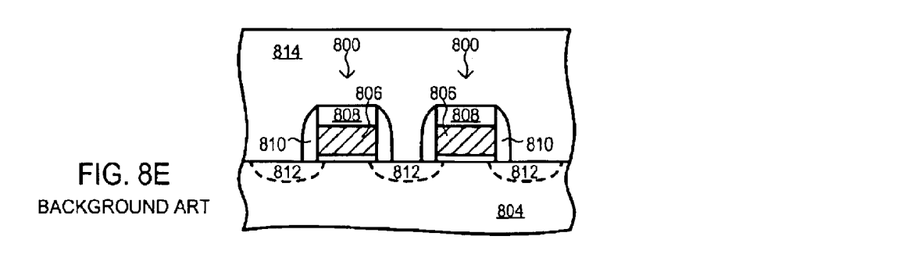
Figure 8F:
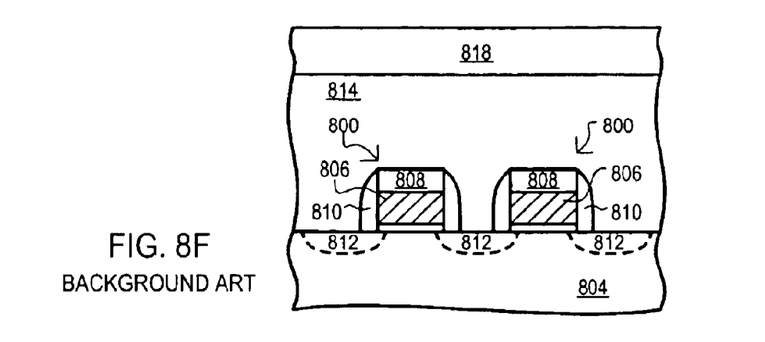
Figure 8G:
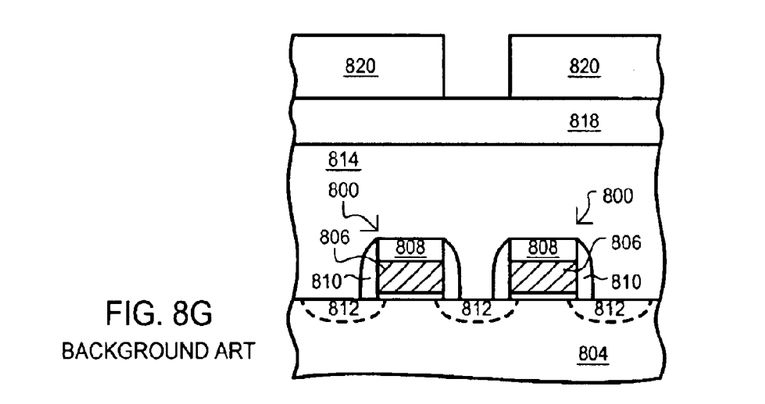
Figure 8H:
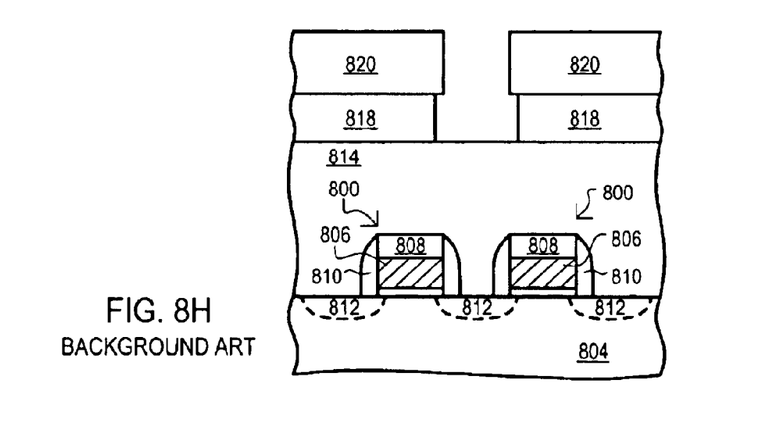

Referring back to FIG. 7, the process 700 continues by reflowing the BPSG (step 708). As noted above, a reflow step can improve planarity of the deposited layer and improve the conformal nature of the BPSG. Reflow can also "density" the BPSG layer, decreasing the reactivity of the dopants to moisture and the like. Referring now to FIG. 8D, a side cross-sectional view of an integrated circuit following reflow is set forth. As shown by the figure, the reflow step has also served to eliminate the voids.

Following reflow (step 708), the BPSG layer is further planarized by chemical-mechanical polishing (CMP) (step 710). A side cross-sectional view of a portion of an integrated circuit following planarization is set forth in FIG. 8E. The upper surface of the BPSG layer 814 is planar, which may make the formation of subsequent structures easier.

Following planarization, a "cap" silicon oxide may be formed over the planarized BPSG layer (step 712). A portion of an integrated circuit following the deposition of a cap silicon oxide layer is set forth in FIG. 8F. The cap silicon oxide 818 may include undoped silicon dioxide and may serve to prevent the migration of the dopants from the BPSG or prevent moisture from migrating into the BPSG. Such a cap silicon oxide 818 may also provide a more stable surface for subsequent layers. Accordingly, the use of BPSG may result in a composite BPSG-cap silicon oxide layer. This may contribute to increases in cycle time and/or fabrication process complexity.

Once a BPSG is layer is capped, a contact etch mask may be formed (step 714). A portion of an integrated circuit following step 714 is set forth in FIG. 8G. The contact etch mask 820 is disposed over the cap silicon oxide 818, and includes openings where contact holes are to be formed.

Due to the composite nature of the deposited insulating layers (cap silicon oxide-BPSG), optimal formation of contact holes may be accomplished with a two step etch process. A first etch (step 716) is applied that may be optimized for the undoped cap silicon oxide 818. A second etch (step 718) may then be applied that is optimized for the BPSG 814. A side cross-sectional view of a portion of an integrated circuit following the first etch is set forth in FIG. 8H, while a side cross-sectional view of a portion of an integrated circuit following the second etch is set forth in FIG. 8I.

Figure 8I:
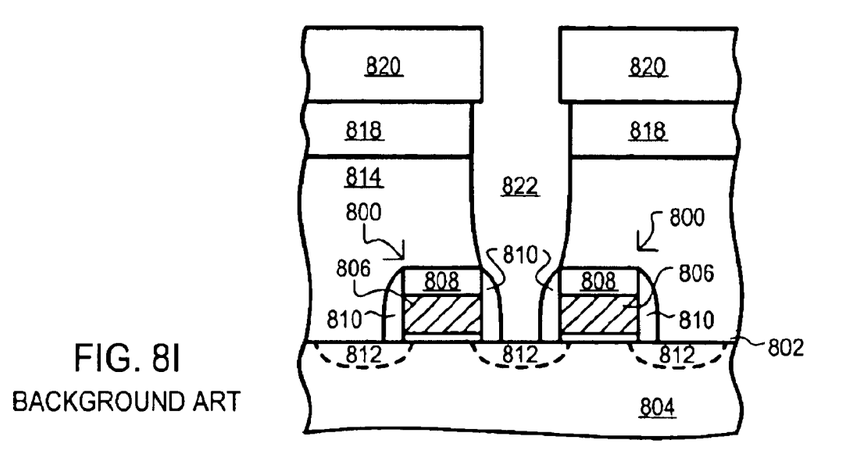

As shown in FIG. 8I, the resulting contact hole 822 is "self-aligned" with the MOSFET gate structures 800. The self-alignment occurs by the insulating portions 808 and sidewall portions 810 insulating the conductive portions 806 from the contact hole 822. As a result, there is no minimum spacing requirement between the edges of the contact hole 822 and, the gate structures 800. The resulting structure may include conductive portions 806 separated from the contact hole 822 by an insulating structure (a sidewall 810 in the example of FIG. 8I) having a lateral width that is less than a critical dimension.

In light of the conventional approach set forth above, it would be desirable to provide an insulating material that allows for a smaller thermal budget than conventional approaches. It would also be desirable to provide an insulating material that reduces the cycle time and/or the complexity involved in fabricating an integrated circuit.

SUMMARY OF THE INVENTION

According to the disclosed embodiments of the invention, methods and structures for forming an insulating layer are set forth in a series of charts and diagrams. The disclosed methods and structures can advantageously fill constrained spaces while avoiding the formation of voids (which may be informally known as "tunnelers" or "tubers"). According to selected embodiments of the invention, a silicon dioxide layer, having relatively high levels of phosphorous doping, may be deposited by high density plasma (HDP) chemical vapor deposition (CVD). Such an insulating layer may fill constrained spaces without an additional reflow step, as is the case with conventional plasma enhanced chemical vapor deposition (PECVD) of borophosphosilicate glass (BPSG).

An advantage of one or more of the disclosed embodiments is that an insulating layer may be provided that does not necessarily have to be subject to a reflow step. By avoiding a reflow step, diffusion regions in a device may be exposed to fewer temperature cycles than a conventional approach. Fewer temperature cycles may result in a more advantageous thermal budget for an integrated circuit fabrication process.

Another advantage of one or more of the disclosed embodiments is that if an insulating layer of highly doped phosphosilicate glass (PSG) is formed, an additional "cap" silicon oxide layer may not have to be deposited over the PSG, as is the case for conventional BPSG approaches. This may provide for faster processing cycle times and/or reduced process complexity.

Yet another advantage of one or more of the disclosed embodiment is that if an insulating layer of PSG is formed without a cap silicon oxide layer, a contact may be formed through the PSG layer in a single etch step. This is in contrast to conventional BPSG approaches which may require one etch step for a cap silicon oxide layer and another for a BPSG layer. This may provide for faster processing cycle times and/or reduced process complexity.

Yet another advantage of the disclosed embodiments is that if an insulating layer of PSG is formed, constrained spaces may be filled with an insulating material that does not include substantial amounts of boron. Lack of substantial amounts of boron may essentially eliminate the formation of boron rich crystals that may produce "micro-masking" defects and/or an undesirably rough insulating layer surface.

Yet another advantage of the disclosed embodiments is that if an insulating layer is formed that does not include substantial amounts of boron, boron may not diffuse out from the insulating layer. Out-diffusion of boron may adversely affect the properties of a transistor and/or conductive lines formed from polysilicon.

DETAILED DESCRIPTION OF THE EMBODIMENTS

Various embodiments will now be described in conjunction with a number of charts and diagrams. The embodiments set forth approaches to forming an integrated circuit in which constrained spaces may be filled with an insulating material. Such an insulating material may be formed without a reflow step, and thus may allow for fewer temperature cycles than conventional approaches to forming insulating layers. An insulating material formed according to the embodiments may be more stable than conventional insulating materials. In addition, or alternatively, an insulating layer according to the embodiments may not include certain undesirable dopants, and thus may not include a cap layer that can often be present in conventional structures.

Figure 1:
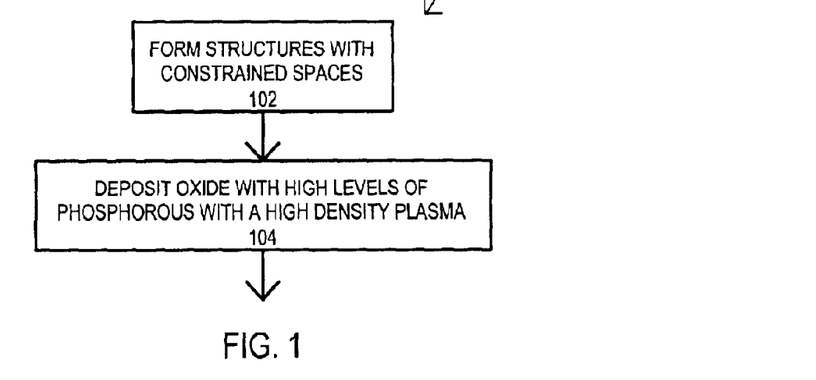
FIG. 1 is a flow diagram of a first embodiment.

Referring now to FIG. 1, a flow diagram is set forth illustrating an approach to filling constrained spaces with an insulating material according to a first embodiment. The first embodiment is designated by the general reference character 100, and may include a step that forms structures with constrained spaces (step 102) and a step of filling the resulting constrained spaces with an insulating material (step 104). An example of a portion of an integrated circuit following a step 102 is set forth in FIG. 2A.

Figure 2A:
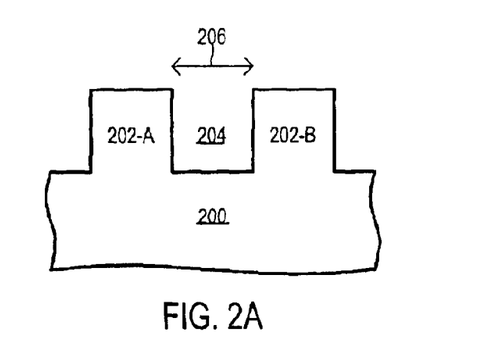
FIGS. 2A and 2B are side cross-sectional views of an integrated circuit according to a first embodiment.

FIG. 2A shows a substrate portion 200. Substrate portion 200 can provide a surface on which structures may be formed and/or in which active devices (such as transistors) may be formed. A substrate portion 200 may include a generally monocrystalline semiconductor substrate, or may also include a substrate with semiconductor portions that may be insulated from one another (e.g., as in silicon-on-insulator, or "SOI" technology, to name just one limited example). Adjacent structures 202-A and 202-B may be provided and/or formed on substrate portion 200. Structures (202-A and 202-B) may be separated from one another by a constrained space 204. A space 204 may be considered "constrained" in that it may present a relatively narrow opening and/or an opening having an aspect ratio that may be problematic to fill by conventional deposition techniques. Some of the possible ways in which structures (202-A and 202-B) may be formed include etching a substrate portion 200, and/or depositing one or more layers and then etching such deposited layers. One example of a constrained space aspect ratio that may be problematic to fill is an aspect ratio that is greater than 7:1.

A lateral width of constrained space 204, shown generally as arrow 206, may represent a critical dimension ("CD") for a fabrication process. For example, a "CD" may represent a minimum spacing between adjacent structures (such as 202-A and 202-B) that results from particular process limitations, desired electrical properties, and/or other design constraints associated with the adjacent structures.

The first embodiment 100 also includes a step 104 of depositing a layer of silicon dioxide that includes relatively high levels of phosphorous. Relatively high levels of phosphorous may include concentrations of phosphorous that exceed those used in other conventional insulating layers, such as borophosphosilicate glass (BPSG). For some approaches, relatively high levels of phosphorous may include levels that are greater than 5% by weight. More substantial departures from conventional approaches may include phosphorous concentrations that are greater than 7% by weight.

This depositing step may further include a high density plasma (HDP). A high density plasma may be defined as a plasma having a charge density that generally exceeds that used in conventional insulating layer deposition approaches (e.g., charge densities used in conventional plasma enhanced and plasma assisted chemical vapor deposition (PECVD and PACVD)). For example, a high density plasma may include a charge density that exceeds that used to deposit conventional PECVD BPSG layers. For some approaches, a high density plasma may include charge densities that generally exceed $10^7$ charged particles per $cm^3$, and more specifically, charge densities in the general range of $10^9$–$10^{12}$ charged particles per $cm^3$. An example of a portion of an integrated circuit following a step 104 is shown in FIG. 2B.

Figure 2B:
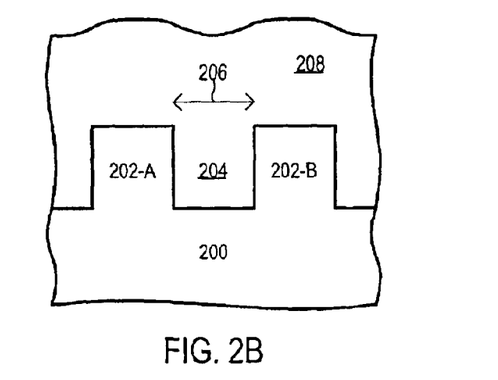

FIG. 2B shows an insulating layer 208 formed over a substrate 200. An insulating layer 208 may fill a constrained space 204 and may include a silicon dioxide layer having a relatively high level of phosphorous dopants. Unlike many conventional BPSG deposition approaches (such as CVD, PACVD, and PECVD), an insulating layer 208 may fill constrained spaces 204 while remaining substantially void free. Consequently, a subsequent reflow step may not be performed before a subsequent polishing, planarizing or depositing step. If a reflow step is not performed, a temperature cycle may be avoided, providing a more advantageous thermal budget for an integrated circuit fabrication process.

While an insulating layer 208 may include other dopants, an insulating layer 208 may be phosphosilicate glass ("PSG"). PSG may include silicon dioxide doped substantially only with phosphorous. An insulating layer 208 of PSG could lack substantial amounts of boron, and thus may be less susceptible to the adverse effects of boron. Consequently, an integrated circuit may be fabricated without a "cap" layer of undoped silicon oxide to prevent diffusion of boron, as is done in many conventional approaches utilizing BPSG. Dispensing with the cap silicon oxide layer may reduce cycle time and/or process complexity.

Figure 3:
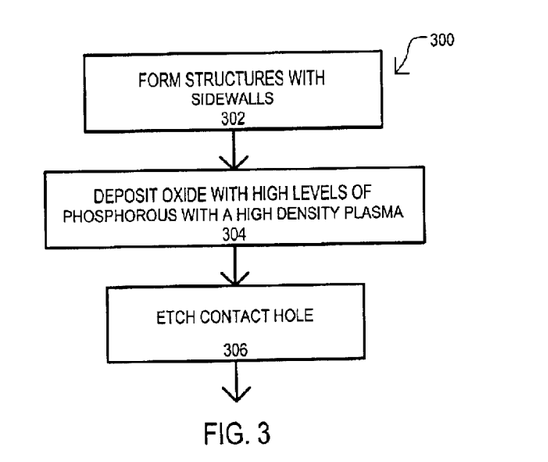
FIG. 3 is a flow diagram of a second embodiment.

Referring now to FIG. 3, a second embodiment is set forth in a flow diagram. A second embodiment 300 is shown to include forming a structure with a sidewall (step 302). A sidewall may insulate a structure in a lateral direction from an adjacent conducting (or semiconducting) material. A sidewall may have a lateral width that is less than a critical dimension ("CD"). As just one example, a sidewall may have a lateral width that is less than a typical structure produced by conventional pattern transfer approaches (such as conventional lithography and etch). One example of a portion of an integrated circuit following a step 302 is set forth in a side cross-sectional view in FIG. 4A.

Figure 4A:
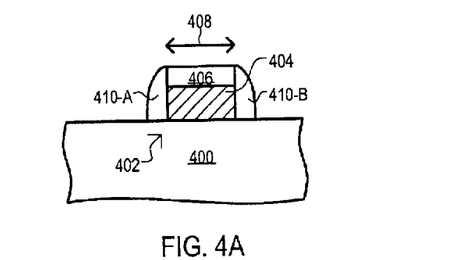
FIGS. 4A–4C are side cross-sectional views of an integrated circuit according to a second embodiment.

FIG. 4A includes a substrate portion 400 on which a structure 402 is formed. A substrate portion 400 may include the various forms described in conjunction with substrate portion 300 of FIG. 3. A structure 402 may include a conductive (or semiconductive) portion 404 and a top insulating portion 406. A top insulating portion 406 may isolate a conductive (or semiconductive) portion 404 from a conducting (or semiconducting) material situated over a structure 402. A structure 402 may have a lateral width that represents a critical dimension 408. Possible critical dimensions may include a lateral width for a structure 402, or alternatively, a spacing between adjacent structures, to name just two examples.

Also included in FIG. 4A are sidewall structures 410-A and 410-B. Sidewall structures (410-A and 410B) may protect a lightly doped source/drain implant region from subsequent implant steps and/or isolate a conductive (or semiconductive) portion 404 from a conducting (or semiconducting) material situated against a side of a structure 402. A lateral width of sidewall structures (410-A and 410-B) may be less than a critical dimension 408. One way in which sidewall structures (410-A and 410-B) may be formed, is by depositing an insulating layer over the sides of a structure 402, and then anisotropically etching the insulating layer. Such sidewall structures (also referred to as "spacers") preferably comprise a material such as silicon dioxide ($SiO_2$) and/or silicon nitride ($Si_3N_4$).

The second embodiment 300 may also include depositing a layer of phosphorous doped silicon dioxide, preferably by HDP CVD (step 304). A relatively high level of phosphorous and high density plasma may include the same general criteria described in conjunction with step 104 of FIG. 1. This may include forming an insulating layer having substantial amounts of phosphorous and insubstantial amounts of boron as dopants. As noted above, such an insulating layer may not include a "cap" silicon oxide layer, reducing cycle time and/or process complexity. A portion of an integrated circuit following a step 304 is set forth in FIG. 4B.

Figure 4B:
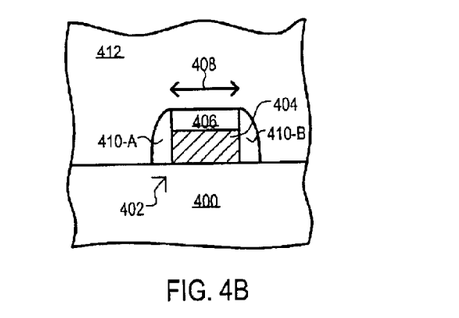

FIG. 4B includes an insulating layer 412 deposited over a structure 402 and corresponding sidewall structures (410-A and 410-B). An insulating layer 412 may include the same general constituents and properties as the insulation layer 208 described in conjunction with FIG. 2. In the event an insulation layer 412 does not include significant amounts of boron, the adverse consequences that may arise from boron migrating into a conductive (or semiconductive) portion 404 may be substantially reduced.

Figure 4C:
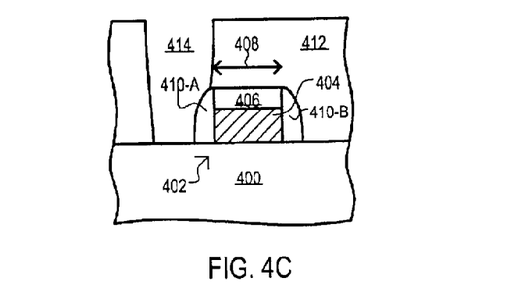

The second embodiment 300 may also include etching a contact hole that may expose one or more sidewall structures (step 306). Such a step preferably includes anisotropically etching to form the contact hole. An anisotropic etch is believed to provide better control over the aspect ratio of the contact hole then an isotropic etch. However, the second embodiment 300 should not be construed as being limited to any particular etch method. It is also noted that a step 306 does not necessarily result in a sidewall structure being entirely exposed. None or only a portion of a sidewall structure may be exposed by a step 306. FIG. 4C sets forth an example of a portion of an integrated circuit following a step 306.

FIG. 4C is shown to include a contact hole 414 formed by etching through an insulating layer 412. A contact hole 414 may expose a sidewall structure 410-A. A contact hole 414 may be considered "self-aligned", as there may be no minimum spacing requirements between a contact hole 414 and an adjacent structure 402. In addition, unlike conventional approaches, such as that set forth in FIGS. 7 and 8A–8I, a contact hole 414 may be etched with a single etch step, as a cap silicon oxide may not be present. In this way, cycle time and/or process complexity may be reduced further. A second embodiment 300 illustrates an approach for forming a self-aligned contact hole 414 through an insulating layer 412 that may reduce the number of temperature cycles in the fabrication process by possibly avoiding a reflow step. A self-aligned contact hole 414 may also be formed through an insulating layer 412 that does not necessarily have to include boron to induce a lower flow temperature. Further, in the event the insulating layer consists essentially of PSG, a cap silicon oxide layer may not be included, reducing cycle time and/or the number of etch steps, as compared to conventional approaches.

Figure 5:
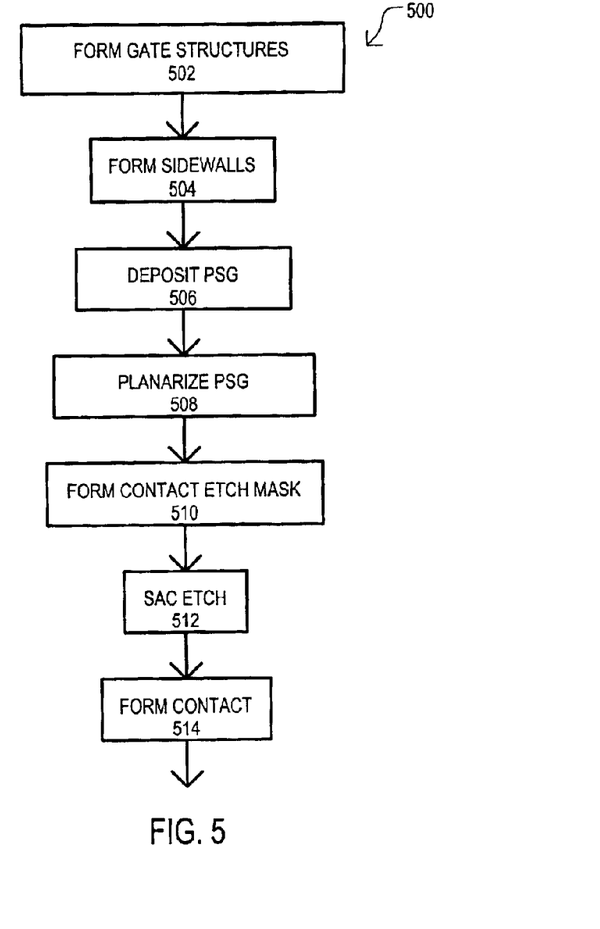
FIG. 5 is a flow diagram of a third embodiment.

Referring now to FIG. 5, a flow diagram shows a third embodiment 500. A third embodiment 500 sets forth a method for forming a self-aligned contact in an integrated circuit that may include insulated gate field effect transistors (IGFETs). One example of an IGFET is a metal-oxide-semiconductor (MOS) FET. A third embodiment 500 may include a first step of forming a gate structure (step 502). Forming a gate structure may include depositing one or more conductive/semiconductive layers, and then patterning the layer(s) to form IGFET gate structures. Forming a gate structure may also include the step of forming a top insulating layer over the IGFET gate layer. The top insulating layer may be patterned at the same time as the gate structures are patterned. An example of a portion of an integrated circuit following a step 502 is set forth in FIG. 6A.

Figure 6A:
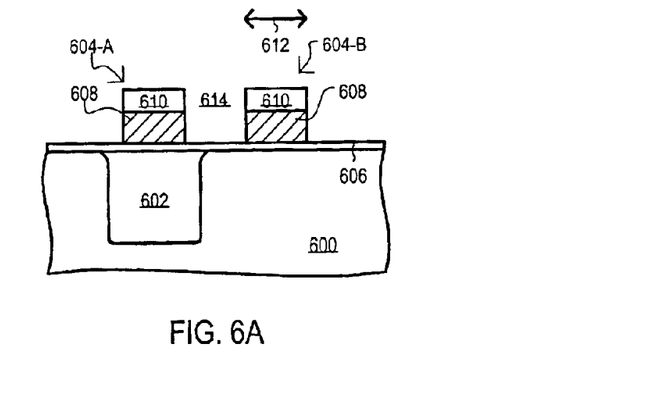
FIGS. 6A–6G are side cross-sectional views of an integrated circuit according to a third embodiment.

FIG. 6A includes a substrate portion 600. A substrate portion 600 may be subject to the variations described in conjunction with FIG. 2. In the particular arrangement of FIG. 6A, a substrate portion 600 may include a shallow trench isolation (STI) structure 602. Gate structures 604-A and 604B may be formed over substrate portion 600 on a gate insulator 606. A gate insulator 606 may comprise silicon dioxide ("oxide"), silicon nitride ("nitride"), or a silicon oxynitride, to name just a few examples.

Gate structures (604-A and 604-B) may include conductive (or semiconductive) portions 608 and insulating portions 610. In the particular example of FIGS. 6A–6G, conductive (or semiconductive) portions 608 may include conventionally doped polysilicon and a layer of silicide. Insulating portions 610 may include silicon nitride or silicon oxide, to name just two examples. A gate length 612 is also set forth in FIG. 6A. A gate length 612 may represent a critical dimension for the integrated circuit fabrication process, as such a feature may represent a gate length or range of gate lengths that may provide adequate transistor performance. In FIG. 6A, gate structures (604-A and 604B) are separated from one another by a constrained space 614. A constrained space 614 may also be a critical dimension, representing a predetermined minimum separation distance or range of distances between adjacent conductive (or semiconductive) lines.

A third embodiment 500 may also include a step of forming sidewalls on gate structures (step 504). The formation of sidewalls may include depositing a layer of undoped silicon oxide over gate structures (604-A and 604-B) and (optionally) then densifying the deposited silicon oxide. Portions of the silicon oxide may then be removed with an anisotropic etch, to form sidewalls (or "spacers"). An integrated circuit following a step 504 is set forth in FIG. 6B.

Figure 6B:
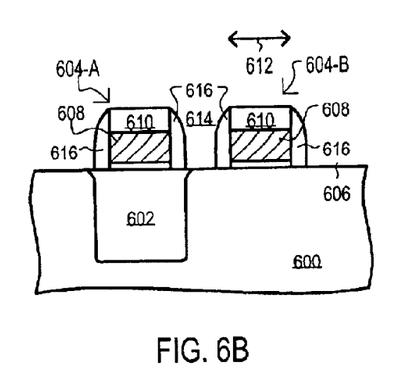

FIG. 6B includes gate structures (604-A and 604-B) with sidewalls 616. Sidewalls 616 may provide insulation for the lateral edges of gate structures (604-A and 604B). The use of sidewalls 616 may result in sidewall structure widths that may be less than a critical dimension (such as a gate length or constrained space width, to name but two examples).

The third embodiment 500 may further include a step of depositing a layer of relatively highly doped phosphosilicate glass (PSG), preferably by a high density plasma (HDP) vapor deposition. In one particular deposition approach, a high density plasma may include low frequency power in a general range of 4000–4500 Watts and high frequency power in a general range of 1200–1500 Watts. PSG may be formed from a plasma comprising a mixture of a silicon source such as silane ($SiH_4$) or a chlorosilane $SiH_xCl_y$, where x+y=4 for example, an oxygen atom source such as ($O_2$), ozone ($O_3$) or nitrous oxide ($N_2O$) for example, and a phosphorous source such as phosphine ($PH_3$), $PH_aCl_b$, a methyl phosphine $PH_a(CH_3)_b$, or an ethyl phosphine $PH_a(C_2H_5)_b$ where a+b=3 for example. In one particular approach, silicon source flows into the plasma chamber may be in the general range of 5–100 standard $cm^3$ per minute (sccm), preferably 10–50 sccm, more preferably 23–30 sccm. Oxygen atom source flows may be in the general range of 20–1000 sccm, preferably 100–500 sccm, more preferably 350–400 sccm. Phosphorous source flows may be in the general range of 10–500 sccm, preferably 50–350 sccm, more preferably 170–200 sccm. Argon may also flow in the reaction chamber at a rate in the general range of 25–40 sccm.

The flow ratios of the silicon source and phosphorous source may be selected from the mathematical possibilities supported by the above ranges such that the target phosphorous level is achieved. However, preferred silicon source to phosphorous source flow rate ratios may be in the general range of 1:20 to 1:2, more preferably 1:10 to 1:5.

Of course, the various power levels and flow rates recited should not be construed as limiting the invention thereto. A relatively high level of phosphorous and high density plasma may include the same general criteria described in conjunction with step 104 of FIG. 1.

Figure 6C:
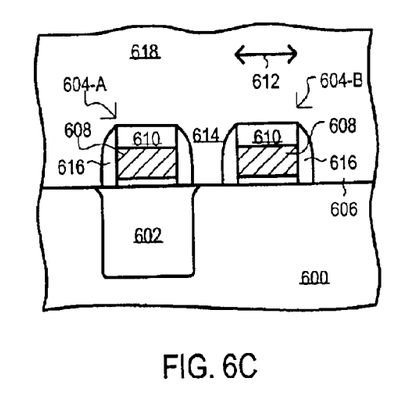
Figure 6D:
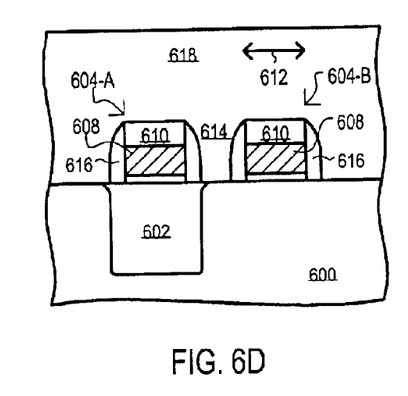

Referring now to FIG. 6C, a side cross-sectional view is set forth illustrating a portion of an integrated circuit following a step 506. An insulating layer 618 is formed over gate structures (604-A and 604-B), including sidewalls 616. An insulating layer 618 may include the same general constituents and properties as insulation layer 208 described in conjunction with FIG. 2B, and/or insulation layer 412 described in conjunction with FIGS. 4B and 4C. Accordingly, an insulating layer 618 may not require a subsequent reflow step, and thereby may result in a more advantageous thermal budget The absence of substantial amounts of boron in insulating layer 618 can have the advantages previously described. Further, a layer of PSG may not require a cap silicon oxide layer, which may reduce cycle time and/or process complexity.

Once an insulating layer is deposited, such as a HDP PSG layer, such an insulating layer may be planarized (step 508). Planarization may be accomplished by a chemical-mechanical polishing (CMP) step, to name just one example.

Alternatively, planarizing may be accomplished by an isotropic etching step, or by a relatively low temperature and/or short duration reflow step, but CMP is preferred. An integrated circuit following step 508 is set forth in FIG. 6D, and is shown to include an insulation layer 618 with a substantially planar surface.

One way to form a contact hole to a substrate may include a step of forming an etch mask over an insulating layer (step 510). The formation of an etch mask pattern may include conventional photolithographic techniques. An integrated circuit following a step 510 is set forth in FIG. 6E.

Figure 6E:
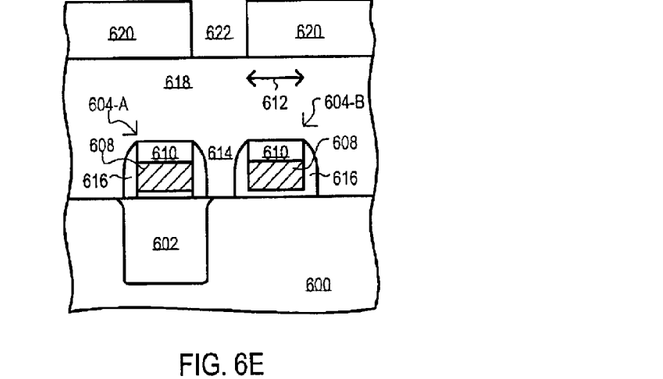

FIG. 6E includes etch mask portions 620 and etch mask opening 622 disposed over insulating layer 618. Etch mask portions 620 may protect insulating layer 618 from a subsequent etch, while etch mask openings 622 may allow exposed portions of an insulating layer 618 to be removed. An etch mask opening 622 may be situated over a location where a contact hole may be formed. In the particular arrangement of FIG. 6E, an etch mask opening 622 may be used to form a self-aligned contact hole. As such, the location of a contact hole may not include a minimum spacing from an adjacent gate structure (604-A or 604-B).

Once an etch mask is formed, a self-aligned contact ("SAC") etch may be performed (step 512). A SAC etch may be a substantially anisotropic reactive ion etch (RIE). A RIE SAC etch may be more selective to insulating layer 618 than to sidewalls 616. In the event an insulating layer 618 does not include an overlying cap silicon oxide layer, a RIE SAC etch may advantageously be a single step etch, and may reduce cycle time and/or process complexity over those processes that produce composite insulation layers. A portion of an integrated circuit following a step 512 is set forth in FIG. 6F.

Figure 6F:
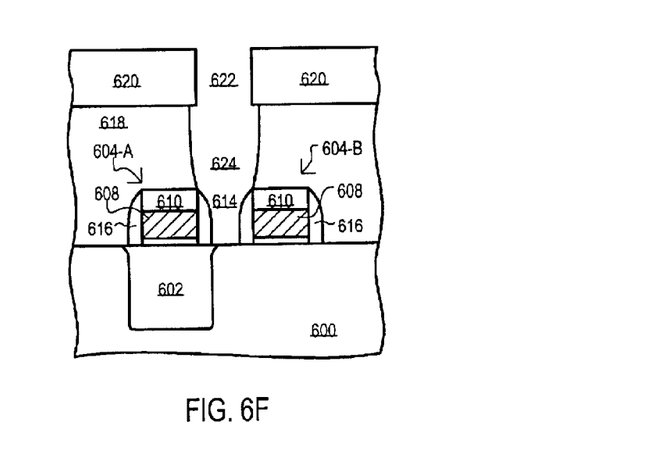

FIG. 6F illustrates the formation of a contact hole 624. A contact hole 624 through insulating layer 618 may have a high aspect ratio (e.g., $\geq 26:1$, preferably $\geq 8:1$, possible $\geq 10:1$). In the particular view of FIG. 6F, opposing sidewalls 616 may be partially exposed by a RIE SAC etch. Sidewalls 616 and top insulating portions 610 may prevent conductive (or semiconductive) portions 608 of a gate structure (604-A and 604-B) from being exposed by a RIE SAC etch.

A third embodiment 500 can also include forming a contact structure (step 514). A contact structure may be formed by removing an etch mask, and then depositing one or more conductive materials in a contact hole, as just one example. Suitable exemplary structures of the contact (which may further include an overlying conductive layer) are described in U.S. patent applications with Ser. No. 08/693,978 (filed Aug. 1, 1996), Ser. No. 08/820,893 (filed Mar. 19, 1997), Ser. No. 08/970,107 (filed Nov. 13, 1997), Ser. No. 08/628,508 (filed Apr. 5, 1996). Additional exemplary structures are described in U.S. Pat. Nos. 5,652,182, 5,861,676, and 5,514,622. The relevant portions of the above cited applications and patents are incorporated by reference herein. A subsequent planarization step may then be applied to provide a substantially planar surface. A portion of an integrated circuit following a step 514 is set forth in FIG. 6G.

Figure 6G:
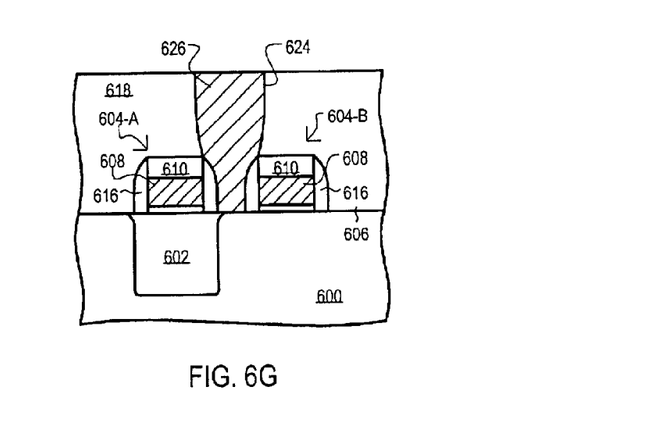

FIG. 6G illustrates a contact 626 formed within a contact hole 624. A contact 626 may provide an essentially vertical conductive path through insulating layer 618 to a substrate portion 600.

A number of embodiments have been described setting forth approaches to forming an insulating layer, and/or forming a contact hole, and/or forming a self-aligned contact hole. Such approaches may be implemented in existing fabrication systems to take advantage of the benefits of the various methods and structures described. As just one example, a manufacturer may change its current fabrication process, which might deposit BPSG or PSG that is not highly doped, to new recipes that provide for relatively highly doped PSG. In addition, or alternatively, a manufacturer may alter its current fabrication process to deposit a PSG layer, with a high density plasma, to fill constrained spaces (such as adjacent gate structures) instead of BPSG. Such a HDP PSG layer may include relatively high levels of phosphorous.

Once appropriate changes to a fabrication method have been made to incorporate the advantages disclosed by illustrated embodiments, a process may also remove a reflow step for a deposited silicon oxide.

Further, by utilizing the advantageous thermal budget illustrated by the disclosed embodiments, a manufacturer may be capable of re-tooling a fabrication process to accommodate smaller geometry transistors, as the undesired diffusion of dopants from substrate diffusion regions may be more tightly controlled.

A structure formed according to some of the embodiments may include an insulating layer formed over constrained spaces that has relatively high levels of phosphorous doping. Such an insulating layer could exhibit relatively high levels of phosphorous content when subjected to various analytical techniques, such as electron dispersive X-ray analysis (EDX), wavelength dispersive X-ray analysis (WDX), auger spectroscopy analysis, secondary ion mass spectrometry (SIMS), or infrared (IR) spectroscopy, such as Fourier Transform IR analysis (FTIR), to name but a few examples.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. An integrated circuit structure, comprising:
    a (semi)conductive gate having a top surface, a side surface, a lateral gate length, and a sidewall structure adjacent to the side surface;
    an insulating layer over the gate structure, the insulating layer including silicon dioxide and a concentration of phosphorous that is greater than five percent by weight; and
    a contact hole through the insulating layer and adjacent to said sidewall structure, the contact hole having a lateral dimension less than the lateral gate length and an aspect ratio of at least 8:1.

2. The structure of claim 1, wherein: the concentration of phosphorous is greater than or equal to seven percent by weight.

3. The structure of claim 1, wherein:
    the lateral dimension is less than or equal to half the lateral gate length.

4. The structure of claim 1, wherein:
    the lateral dimension is less than a critical dimension of the integrated circuit.

5. An integrated circuit interconnect structure , comprising:
    a space disposed between circuit structures having a cross sectional aspect ratio of greater than 7:1; and an insulating layer formed in the space comprising phosphorous doped silicate glass (PSG) with a concentration of phosphorous that is greater than 7% by weight and having essentially no boron.

6. The integrated circuit interconnect structure of claim 5, wherein:

the insulating layer is a high density plasma PSG formed by high a density plasma deposition.

7. The integrated circuit interconnect structure of claim 5, wherein:

the insulating layer is a non-reflow insulating layer that is not subject to a reflow step.

8. The integrated circuit interconnect structure of claim 7, wherein:

the insulating layer includes a planarized top surface.

9. The integrated circuit interconnect structure of claim 5, further including:

a contact hole formed in the space through at least a portion of the insulating layer.

10. The integrated circuit interconnect structure of claim 5, wherein:

the circuit structure include gate structures comprising a conductive gate covered with a top insulator.

11. The integrated circuit interconnect structure of claim 10, wherein:

the gate structures further comprise the conductive gate being covered with insulating sidewalls.

12. The integrated circuit interconnect structure of claim 10, wherein:

the conductive gates each have agate width that is greater than a width of the space.

* * * * *